July 28, 1953

S. I. RAMBO 2,647,241

TUNING STUB

Filed Oct. 17, 1949

WITNESSES:
E. A. McCloskey
R. G. Brodahl

INVENTOR
Sheldon I. Rambo.
BY
Hymen Diamond
ATTORNEY

Patented July 28, 1953 2,647,241

UNITED STATES PATENT OFFICE 2,647,241

TUNING STUB

Sheldon I. Rambo, Baltimore, Md., assignor to Westinghouse Electric Corporation, East Pittsburgh, Pa., a corporation of Pennsylvania Application October 17, 1949, Serial No. 121,810

5 Claims. (Cl. 336—123)

This invention relates to the tuning of high frequency heating circuits, and more particularly it relates to a variable inductance tuner for use in said heating circuits.

In the heating of dielectric loads by high frequency energy, it is desirable to provide proper generator loading by series or parallel tuning the electrode system for optimum power transfer. In accordance with the teaching of the prior art of which I am aware, transmission line tuning stubs of the trombone type using a sliding short circuiting bar are employed because of their relative simplicity and high power capacity; however, this tuning stub is unsatisfactory in the respect that the movable shorting bar is subject to rapid mechanical wear and contact troubles which often result in disagreeable arcing and eventual total destruction of the line and slides.

It is an object of the present invention to provide an improved variable inductance tuner comprising a transmission line having variable spacing.

Another object of my invention is to provide a variable spaced tuning stub which has no objectionable pigtail or flexible connections.

A further object of my invention is to provide a tuning stub having a variable spacing which has a very low minimum inductance without the necessity of reducing excessively the spacing between the conductors.

It is another object of my invention to overcome the objectionable mechanical defects of the prior art variable inductance tuners.

A still further object of my invention is to provide tuning means for use in dielectric heating circuits by which the desired tuning can be effected without the necessity of changing the electrodes which are intended for connection to external circuits and thereby remain independent of tuning stub adjustment.

In accordance with my invention, a tuning stub having a variable inductance by reason of the provision made in its construction for varying the spacing between its conductors is connected with relation to a dielectric heating capacitor to compensate for changes in the effective capacitance presented by said capacitor when the dielectric material of the latter is being heated. A transmission line, which is less than a quarter-wave length long at the frequency of operation, presents an inductive reactance. For optimum power transfer to a terminating load, a power transmission line should be terminated in its characteristic impedance.

By utilizing the proper length tuning stub in relation to the load capacitance as taught by applicant's invention, the terminating impedance may be made to approach more closely, by tuning, this ideal and desirable characteristic impedance. Tuning of this combination of terminating load elements may be effected by the tuning stub.

These and other objects are effected by my invention as will be apparent from the following description and claims taken in accordance with the accompanying drawings forming a part of this application in which:

Figure 1:
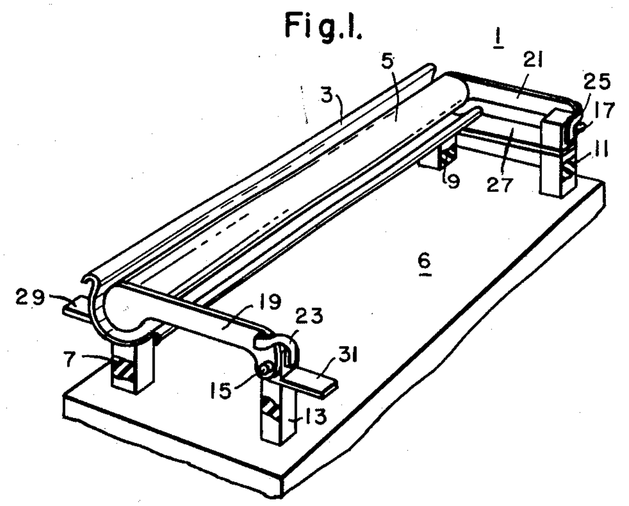
Figure 1 is a perspective view of my variable inductance tuning stub.

In Fig. 1, a tuning stub 1 is shown which consists of a coaxial transmission line comprising an outer semi-tubular shield conductor 3 and an inner cylindrical core conductor 5. The outer conductor 3 is connected to a base member 6 through insulating supports 7 and 9. The inner core member 5 is connected to the insulating supports 11 and 13 through hinge connections 15 and 17 where said supports are fastened to the cross members 19 and 21 which hold the inner conductor 5 in its relative position with respect to the outer conductor 3. Flexible couplings 23 and 25 are provided around the hinge fastenings 15 and 17 to obviate mechanical and electrical difficulties at these points. The inner core member 5 is so hinged that it may be relatively moved into and out of the outer conductor 3. A short circuiting strap 27 is provided between the inner and outer conductors at one end of the tuning stub. At the other end of the tuning stub, a terminal 29 is provided for electrical connection to the outer conductor 3, and a second terminal 31 is provided for electrical connection to the inner conductor 5. These latter terminals 29 and 31 are adapted for connection into the high frequency circuit to be tuned.

It is evident from Fig. 1 that the terminals 29 and 31, which are provided for connection to external circuits, remain fixed in their original positions independent of any tuning adjustment of the stub.

Figure 2:
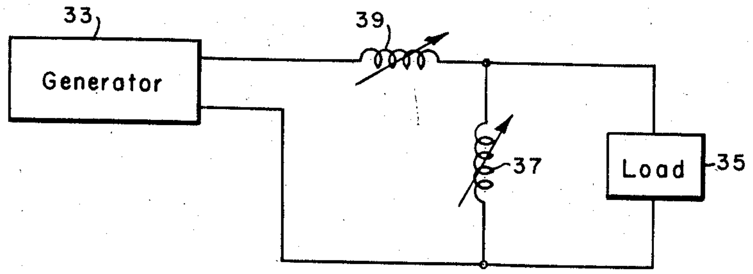
Fig. 2 is a schematic diagram showing the use of my tuning stub for tuning a high frequency heating circuit.

Fig. 2 shows a high frequency generator 33 connected to a load 35. In this case, the load 35 is a dielectric heating unit including the material to be dielectrically heated. One tuning stub 37 is shown connected in parallel with the load 35. A second tuning stub 39 is shown connected in series with the load 35. The tuning stubs 37 and 39 are identical to the tuning stub shown in Fig. 1 and described hereinbefore. By varying tuning stubs 37 and 39, a proper impedance match can be effected between the load 35 and the generator 33. Thus, the optimum power can be transferred between the generator 33 and the load 35.

In the operation of the apparatus shown in Fig. 1, the tuning stub 1 is in effect a coaxial transmission line adapted to have the spacing between the inner conductor 5 and the outer conductor 3 varied. As the spacing between the inner and outer conductors is decreased, the effective inductance of the tuning stub which is presented to the high frequency circuit is decreased. As most of the inductance change takes place in the first 90° of rotation, the moving element 5 usually needs to rotate only through 90°. In dielectric heating applications, as the temperature of the object to be heated between the electrodes rises, moisture is driven from the object and the effective capacitance of the load decreases. As an optimum transfer of energy is effected when the terminating impedance presented to the line equals the characteristic impedance, it therefore becomes necessary to change the overall impedance presented by the dielectric load circuit to the line from the new impedance resulting when said change in the load capacitance is effected back to the previous, more desirable terminating impedance. The effective impedance presented to the line feeding the load circuit can be changed by providing a tuning stub such as shown by the applicant, either in parallel or in series with said dielectric load. This tuning can be accomplished by varying the spacing between the outer and inner conductors 3 and 5 of applicant's tuning stub 1. A section of a transmission line which has been short circuited at one end will for the first quarter-wave length have a current wave which lags its voltage wave when the line is excited. This represents an inductive reactance. The value of this inductive reactance can be determined by obtaining the ratio of the voltage to the current at the input end of the short-circuited line which is opposite said short-circuited end. A short-circuited line has an inductive reactance when its length is less than one-quarter wave length, between one-half and three-quarters wave length, between one and one-and-one-quarter wave lengths, etc.

The present tuning stub can be made to present the desirable inductive reactance by choosing properly the length of the tuning stub line itself. Once the inductive characteristic has been so determined, this inductive reactance can be varied by changing only the spacing between the inner and outer conductors of the tuning stub.

The operation of Fig. 2 incorporates the above-described operation with reference to Fig. 1 into the circuit between a generator 33 and a load 35. As pointed out above, the most satisfactory transfer of electrical energy between a supply and a load can be effected when the effective impedance, terminating the transmission line from the supply, equals the characteristic impedance of that transmission line. In actual practice, the load per se seldom represents such an impedance. Therefore, some means external to the load is very desirable, which in combination with the load will present the desired effective impedance termination to the line. As the load in a dielectric heating application is primarily capacitative, a balancing inductance is needed. Also, the load capacitance usually changes as the temperature of the object to be heated rises. For this reason, a variable inductance means is necessary to compensate for the change in the load capacitance. The combination of the load capacitance and the present tuning stub presents, to terminate the transmission line from the supply generator, a variable impedance LC circuit. By tuning the LC circuit, any desirable effective terminating impedance for said line can be obtained. Actual tuning of this LC circuit can be accomplished by varying the spacing between the inner conductor and the outer conductor of the applicant's tuning stub to present to the transmission line from the supply generator the proper effective terminating impedance for the condition of optimum power transfer.

Although I have illustrated my variable inductance tuning member for tuning a high frequency heating circuit for optimum power transfer to the energy utilizing system or heating electrodes, it is understood that it may be used in any application where a variable inductance is required.

While I have shown my invention in one form only, it will be obvious to those skilled in the art that it is not so limited, but is susceptible of variable changes and modifications without departing from the spirit thereof; and I desire, therefore, that only such limitations shall be placed thereupon as I specifically set forth in the appended claims.

I claim as my invention:

1. In a high frequency coaxial transmission line, the combination of, a substantially semi-tubular outer conductor, an inner cylindrical conductor, said inner conductor being hinged to rotate about a point outside the diameter of the outer conductor such that the inner conductor is movable relative to the outer conductor to effect thereby a variable spacing therebetween.

2. In a transmission line having concentric conductors, the combination of a support member, an outer tubular conductor fixed to said support member, and an inner conductor hinged to said support member at a point outside the diameter of the outer conductor such that the inner conductor is adapted thereby to move relative to the outer conductor.

3. In a variable inductance transmission line adapted to tune an energy transfer system, the combination of a common base member, a hollow outer semi-circular conductor insulated from and supported by said base member, and an inner conductor insulated from and pivoted to said base member at a point on the base member outside the diameter of the outer conductor such that the inner conductor is thereby movable relative to the outer conductor.

4. In a variable inductance transmission line, the combination of, a support member, a semi-tubular outer conductor, and an inner conductor hinged to said support member at a point relative to the center of the outer conductor which is outside the diameter of the outer conductor such that the inner conductor is rotatable around said point and thereby movable relative to the outer conductor.

5. In a variable inductance transmission line, the combination of a common support member, a semi-tubular outer conductor insulated from and supported by said support member, and an inner conductor insulated from and pivoted to said support member at a point on the support member which is at a distance from the center of the outer conductor which is greater than the diameter of the latter conductor, said inner conductor being thereby movable relative to the outer conductor.

SHELDON I. RAMBO.

References Cited in the file of this patent

UNITED STATES PATENTS

| Number | Name | Date |
|---|---|---|
| 2,405,437 | Leeds | Aug. 6, 1946 |
| 2,416,827 | George | Mar. 4, 1947 |
| 2,483,419 | Karmin | Oct. 4, 1949 |
| 2,494,596 | Vahle | Jan. 17, 1950 |
| 2,511,586 | Hubbard | June 13, 1950 |
| 2,516,287 | Aske | July 25, 1950 |
| 2,551,756 | Mittelmann | May 8, 1951 |
| 2,560,685 | Cooper | July 17, 1951 |
| 2,575,199 | Stutt | Nov. 13, 1951 |
| 2,578,429 | Karplus | Dec. 11, 1951 |

FOREIGN PATENTS

| Number | Country | Date |
|---|---|---|
| 598,926 | Great Britain | Mar. 1, 1948 |